(12) United States Patent
Dede (10) Patent No.: US 10,562,469 B2
(45) Date of Patent: Feb. 18, 2020

(54) COOLING ASSEMBLIES FOR COOLING HEAT GENERATING COMPONENTS AND VEHICLES AND ELECTRONICS ASSEMBLIES INCORPORATING THE SAME

(71) Applicant: Toyota Motor Engineering & Manufacturing North America, Inc., Erlanger, KY (US)

(72) Inventor: Ercan M. Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 15/782,536

(22) Filed: Oct. 12, 2017

(65) Prior Publication Data

US 2019/0111862 A1    Apr. 18, 2019

(51) Int. Cl.
*B60R 16/02* (2006.01)
*H05K 7/20* (2006.01)

(52) U.S. Cl.
CPC .......... *B60R 16/02* (2013.01); *H05K 7/2039* (2013.01); *H05K 7/20145* (2013.01); *H05K 7/20636* (2013.01); *H05K 7/20927* (2013.01)

(58) Field of Classification Search
CPC ............. H05K 7/2039; H05K 7/20145; H05K 7/20872; H05K 7/20927; B60R 16/02
USPC .......................................................... 361/696
See application file for complete search history.

(56) References Cited

U.S. PATENT DOCUMENTS

| | | |
|---|---|---|
| 6,450,275 B1 | 9/2002 | Gabriel et al. |
| 7,334,422 B2 | 2/2008 | Zywiak et al. |
| 8,482,919 B2 * | 7/2013 | Dede .................... H01L 23/473 165/80.4 |
| 8,995,134 B2 | 3/2015 | Saez-Zamora et al. |
| 9,237,678 B2 | 1/2016 | Arai |
| 9,480,149 B2 | 10/2016 | Mokhtarzad |
| 9,560,790 B2 | 1/2017 | Joshi et al. |
| 2004/0057211 A1 * | 3/2004 | Kondo .................... G06F 1/20 361/696 |
| 2015/0022973 A1 * | 1/2015 | Ballnik .............. H05K 7/20945 361/696 |
| 2015/0156914 A1 | 6/2015 | Kwak et al. |

OTHER PUBLICATIONS

"Cooling of power electronics", http://ep-us.mersen.com/fileadmin/catalog/Literature/Brochures/BR-Cooling-of-Power-Electronics-Brochure.pdf, Accessed/Published Date: Jun. 7, 2016.
"Thermal control of power electronics of electric vehicles with small channel coolant boiling", https://energy.gov/sites/prod/files/2015/07/f24/vss132_singh_2015_o.pdf, Accessed/Published Date: Jun. 7, 2017.

* cited by examiner

*Primary Examiner* — Mukundbhai G Patel
(74) *Attorney, Agent, or Firm* — Dinsmore & Shohl LLP (57) ABSTRACT

An electronics assembly comprising at least one circuit board substrate comprising a fluid inlet channel and a fluid outlet channel and at least one heat generating component coupled to the circuit board substrate. The at least one heat generating component is fluidly coupled to the fluid inlet channel and the fluid outlet channel. A heat exchanger is directly coupled to the circuit board substrate and comprises an inlet plenum fluidly coupled to the fluid outlet channel of the circuit board substrate and an outlet plenum fluidly coupled to the inlet channel of the circuit board substrate. A pump is fluidly coupled to the circuit board substrate and the heat exchanger.

17 Claims, 5 Drawing Sheets

COOLING ASSEMBLIES FOR COOLING HEAT GENERATING COMPONENTS AND VEHICLES AND ELECTRONICS ASSEMBLIES INCORPORATING THE SAME

TECHNICAL FIELD

The present specification generally relates to cooling assemblies and, more specifically, to cooling assemblies incorporating an integrated heat exchanger, as well as vehicles and electronics assemblies incorporating the same.

BACKGROUND

Power electronics systems may be used in electrified vehicles to power one or more components within the vehicle. During operation, electronic components, such as power electronic systems or circuits, semiconductor devices, and the like, generate heat that needs to be appropriately dissipated to keep the electronic components at a temperature within an operational temperature range. Hence, electrified vehicles may use one or more cooling systems to cool the power electronics circuits.

Present cooling systems for cooling power electronics systems in applications such as electrified vehicles may require a substantial amount of piping to route cooling fluid in a closed loop system. A radiator or other heat exchange system may be positioned separately from the heat generating components of the system due to various mechanical, thermal, spatial, or other design considerations. For example, a radiator may be spaced away from heat generating components in an area where relatively lower air temperature exists in order for the relatively lower temperature air to pass over the cooling coils of the radiator. These constraints may add to the amount of piping required to route cooling fluid between the heat generating components and the radiator.

SUMMARY

In one embodiment, an electronics assembly includes at least one circuit board substrate comprising a fluid inlet channel and a fluid outlet channel with at least one heat generating component coupled to the circuit board substrate. The at least one heat generating component is fluidly coupled to the fluid inlet channel and the fluid outlet channel. A heat exchanger is directly coupled to the circuit board substrate and comprises an inlet plenum fluidly coupled to the fluid outlet channel of the circuit board substrate and an outlet plenum fluidly coupled to the inlet channel of the circuit board substrate. A pump is fluidly coupled to the circuit board substrate and the heat exchanger.

In another embodiment, a vehicle includes an electronics assembly comprising at least one circuit board substrate with a fluid inlet channel and a fluid outlet channel. The circuit board substrate includes at least one heat generating component coupled to the circuit board substrate, wherein the at least one heat generating component is fluidly coupled to the fluid inlet channel and the fluid outlet channel. A heat exchanger is directly coupled to the circuit board substrate, the heat exchanger comprising an inlet plenum fluidly coupled to the fluid outlet channel of the circuit board substrate and an outlet plenum fluidly coupled to the inlet channel of the circuit board substrate. A pump is fluidly coupled to the circuit board substrate and the heat exchanger.

In yet another embodiment, a cooling assembly comprises a heat exchanger having an inlet plenum, an outlet plenum, and at least one cooling line fluidly coupled to the inlet plenum and the outlet plenum. At least one cooling fan is coupled to the heat exchanger. One or more slots are configured to receive at least one circuit board substrate of at least one circuit board assembly, and the one or more slots are positioned at one of the heat exchanger and the at least one cooling fan.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are generally directed to cooling assemblies for cooling heat generating components, such as power electronic devices. More particularly, embodiments are directed to cooling assemblies having a heat exchanger that is directly coupled to one or more circuit board substrates. Embodiments are also directed to vehicles and electronics assemblies incorporating such cooling assemblies. The cooling assemblies described herein may be useful in cooling applications with particular size, shape, and/or weight constraints such as, for example, electrified vehicles. The circuit board scale cooling assemblies described herein may, among other things, require less piping, be a modular design, and/or have a compact design. Accordingly, the electronics assemblies and vehicles incorporating the cooling assemblies described herein may cost less to manufacture, be easier to implement, and may generate additional cooling capacity while reducing the need for significant amounts of material, labor, and electrical power requirements.

Figure 1:
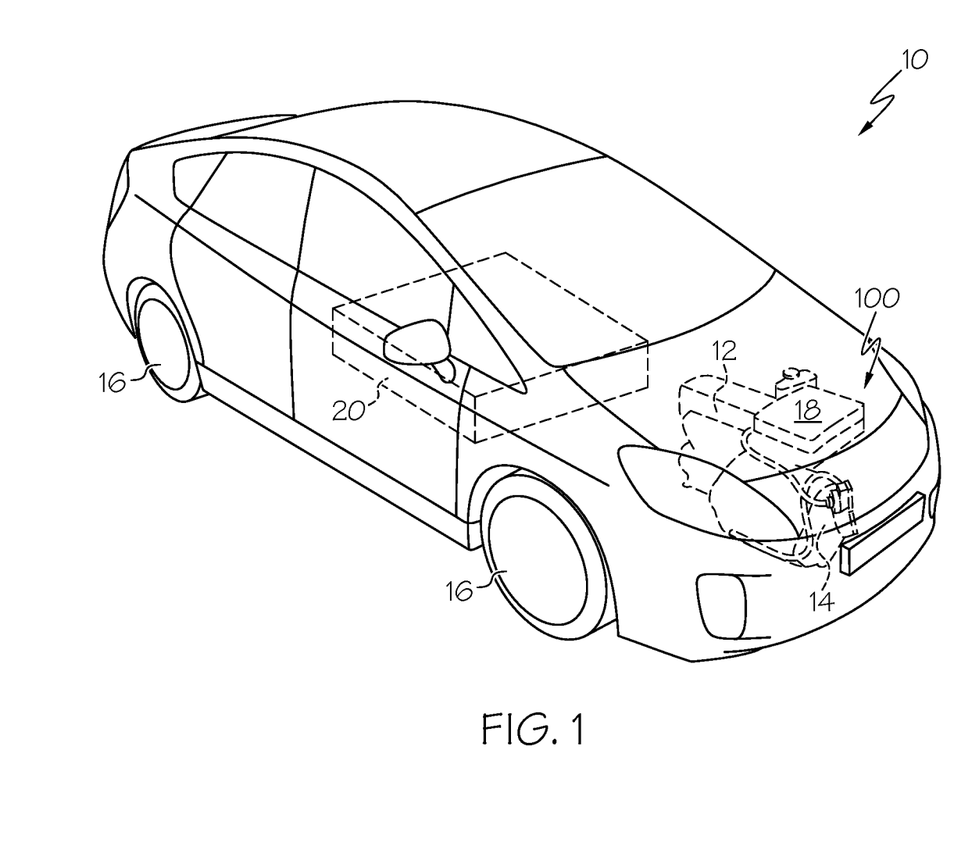
FIG. 1 schematically depicts a vehicle having a power electronics cooling assembly cooling one or more power electronics devices, according to one or more embodiments shown and described herein.

Referring now to FIG. 1, an example vehicle 10 having a circuit board scale, loop cooling assembly for cooling heat generating components of the vehicle 10 is shown. As a non-limiting example, the vehicle 10 may be an electrified vehicle, such as a hybrid vehicle, a plug-in electric hybrid vehicle, an electric vehicle, or any vehicle that utilizes or partially utilizes an electric motor, such as, for example, electric motor 14. It should be understood that embodiments described herein may also be used to cool heat generating components of non-electrified vehicles. Further, although the electronics assemblies and cooling assemblies are described herein in the context of vehicles, embodiments are not limited thereto. Rather, the electronic assemblies 100 and cooling assemblies 101 (see FIGS. 2 and 3) described herein may be used in any application where heat generating components are to be cooled.

The vehicle 10 depicted in FIG. 1 is configured as a hybrid vehicle or a plug-in hybrid vehicle, but embodiments are not so limited. The vehicle 10 generally comprises a gasoline engine 12 and the electric motor 14, both of which are configured to provide rotational movement to the wheels 16, such as, for example, through a drive train, of the vehicle 10 to propel the vehicle 10 down the road. The vehicle 10 further comprises an electronics assembly 100 including at least one heat generating component, as described in more detail below.

Aspects or embodiments of the various electronics assemblies 100 described herein may be incorporated into larger power circuits, such as inverter and/or converter circuits of the vehicle 10. As shown in FIG. 1, the electronics assembly 100 includes a power circuit 18 that is electrically coupled to the electric motor 14. The power circuit 18 may be configured as an inverter and/or a converter circuit that provides electrical power to the electric motor 14. The power circuit 18 may in turn be electrically coupled to a power source, such as, for example, a battery bank 20 for receiving electrical power.

Embodiments of the vehicle 10 may comprise one or more battery banks 20. The batteries contained in the one or more battery banks 20 may be any type of battery now known or later discovered, such as, for example, lithium ion batteries or lead acid batteries. The one or more battery banks 20 may be charged during operation of the vehicle 10, such as, for example, by a motor/generator such as the electric motor 14 or while the vehicle 10 is not in operation, such as, for example, by a charging station external to the vehicle 10.

As the one or more power circuits 18 convert the electrical energy of the battery bank 20 for use in the vehicle 10, they will generate heat and therefore should be cooled. As used herein, the term "heat" may generally refer to an environmental condition associated with temperature. Thus, heat may include any type of thermal mass or thermal energy. As such, the terms "heat," "thermal mass," and "thermal energy" may be used interchangeably herein.

Figure 2:
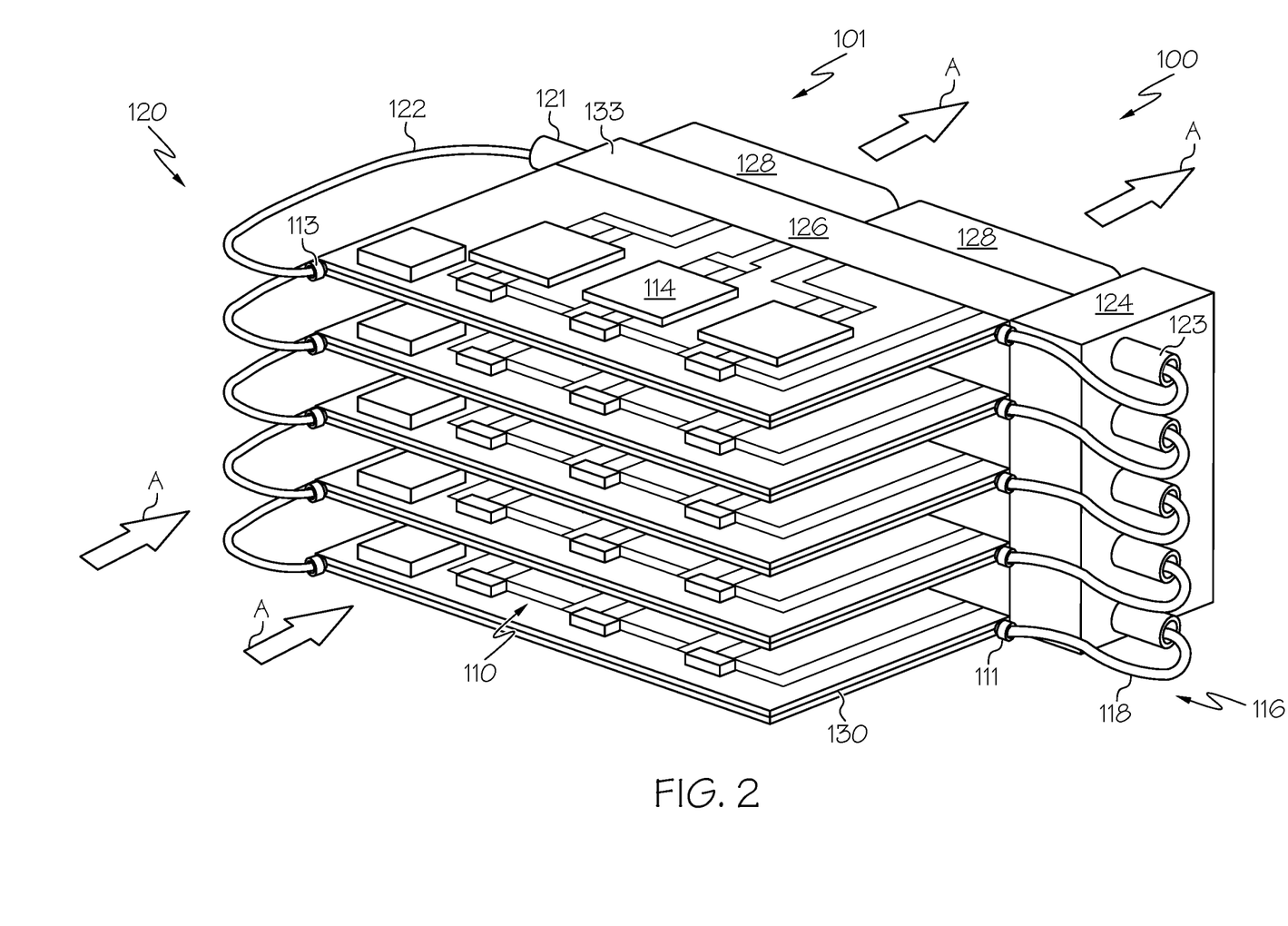
FIG. 2 schematically depicts the cooling assembly of the vehicle of FIG. 1, according to one or more embodiments shown and described herein.

Referring now to FIG. 2, an example electronics assembly 100 includes one or more circuit board assemblies 110 comprising one or more circuit board substrates 130 and one or more heat generating components 114. The one or more circuit board substrates 130 may be any substrate configured for mounting electronic devices, such as printed circuit board substrates, for example. Example circuit board substrates include, but are not limited to, FR-4, FR-1, CEM-1, CEM-3, HTCC, LTCC, glass, and Teflon.

The heat generating components 114 may be any component that generates heat during operation, such as electronic devices. Non-limiting heat generating components include, microcontrollers, processors, application specific integrated circuits, optical integrated circuits, passive electronic components, and bi-polar transistors, insulated-gate bi-polar transistors, field-effect transistors, metal-oxide field-effect transistors, and silicon coated rectifiers. As a non-limiting example, the heat generating components 114 are switching power semiconductor devices providing a power inverter circuit to drive the electric motor 14 of the vehicle 10. However, it should be understood that embodiments are not limited to power inverter circuits.

In the illustrated embodiment depicted in FIG. 2, the electronics assembly 100 includes five circuit board assemblies 110 each comprising three heat generating components 114. It should be understood that embodiments include any number of circuit board assemblies 110 and any number of heat generating components 114 may be provided.

The example electronics assembly 100 further includes an example cooling assembly 101 that is directly coupled to the one or more circuit board assemblies 110 and operable to cool the at least one heat generating component 114. The example cooling assembly 101 includes a supply header 116 comprising one or more cool piping legs 118, a return header 120 comprising one or more warm piping legs 122, one or more pumps 124, a heat exchanger 126, such as, for example, a radiator, and one or more cooling fans 128.

Figure 4:
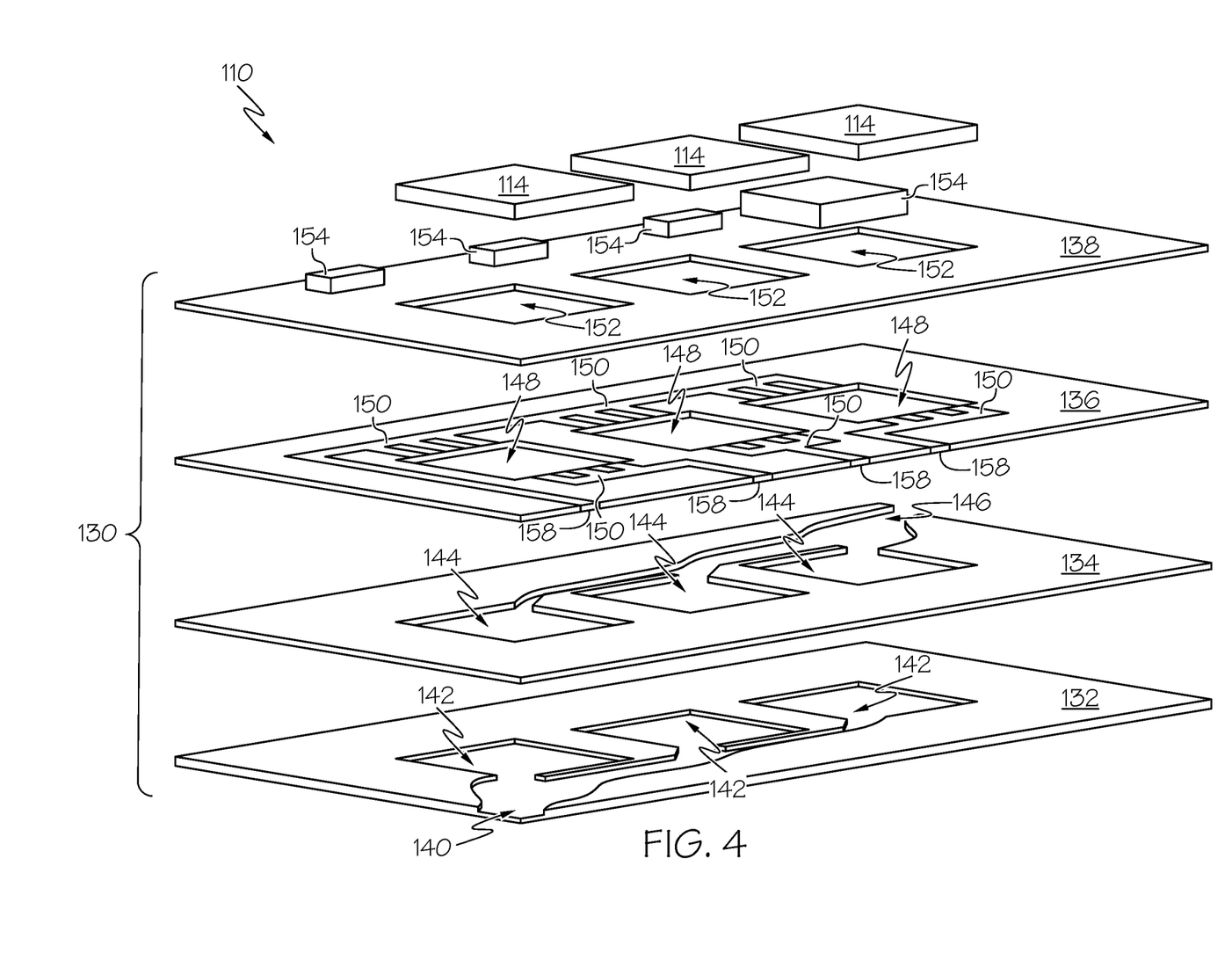
FIG. 4 schematically depicts an exploded view of a circuit board assembly housing a plurality of power electronics devices cooled by the cooling assembly of FIG. 2, according to one or more embodiments shown and described herein.

In some embodiments, the circuit board substrates 130 of the circuit board assemblies 110 may having internal cooling channels (not shown in FIG. 2) that are fluidly coupled to the cooling assembly 101. The internal cooling channels (e.g., see FIG. 4) of the circuit board substrates 130 may be fluidly coupled to the supply header 116 and the return header 120 of the electronics assembly 100 by way of cool piping legs 118 and warm piping legs 122, respectively, such that cooling fluid can be supplied to and returned from each of the circuit board assemblies 110. A non-limiting example of a circuit board assembly 110 is illustrated by FIG. 4 and described in more detail below.

Still referring to FIG. 2, cooling fluid flows through the individual circuit board substrates 130 of the illustrated embodiment in parallel, i.e., each individual circuit board substrate 130 receives cooling fluid individually from the outlet plenum 123 directly via its respective cool piping leg 118. Parallel cooling may be advantageous in certain circumstances, such as, for example, when each of the individual circuit board assemblies 110 of the electronics assembly 100 produces an equivalent amount of heat. This may be the case, for example, when all of the circuit board assemblies 110 of the electronics assembly 100 contain the same elements, such as, for example, when all the circuit board assemblies 110 cooled by a single electronics assembly 100 comprise only power inverter circuits or only converter circuits. Parallel cooling may uniformly remove heat from the heat generating components 114 of the circuit board assemblies 110.

However, embodiments are contemplated in which the cooling fluid flows through the individual circuit board assemblies 110 in series. As a non-limiting example, in cases in which the heat generated by the various circuit board assemblies 110 is not equivalent, it is contemplated that various circuit board assemblies 110 of the plurality of circuit board assemblies 110 may receive cooling fluid in series, in parallel, or some combination of the two based on individual cooling requirements.

Still referring to FIG. 2, each circuit board assembly 110 comprises one or more fluid inlets 111 and one or more fluid outlets 113. The fluid inlet 111 is in fluid communication with the cold fluid discharge of the heat exchanger 126 via the pump 124, the outlet plenum 123, and the cool piping leg 118 of the supply header 116. The fluid outlet 113 is in fluid communication with the warm fluid inlet of the heat exchanger 126 via the return header 120 via the warm piping leg 122 and the inlet plenum 121 such that a cooling loop is formed. The various cooling loops may be connected in parallel or in series as described above. Further, it is contemplated that any suitable fixed or quick disconnect fluid coupling can connect the circuit board assembly 110 to the warm piping leg 122 and cool piping leg 118 to the inlet plenum 121 and the outlet plenum 123, respectively.

One or more pumps 124 may impart differential pressure to cause the cooling fluid to flow within the various cooling loops. The one or more pumps 124 may be powered by the electronics assembly 100 or by some other means. The one or more pumps 124 may comprise any type of pump that is sufficient for imparting a differential pressure within a cooling loop. For example, embodiments of the electronics assembly 100 may include reciprocating pumps, rotary pumps, screw-type pumps, axial flow pumps, positive displacement pumps, centrifugal pumps or any other type of pump or pumps.

The one or more pumps 124 may be placed between the heat exchanger 126 and the one or more circuit board assemblies 110 but embodiments are not so limited. Aspects of the electronics assembly 100 include embodiments in which the one or more pumps 124 are placed between the one or more fluid outlets 113 of the circuit board assemblies 110 and the heat exchanger 126. Regardless of the relative location of the pumps 124 within a cooling loop, the pumps 124 pump the cooling fluid within the cooling loop to pass the cooling fluid through the heat exchanger 126 and the one or more circuit board assemblies.

In the example embodiment shown in FIG. 2, the cooling fluid flowing through the cooling loop or loops absorbs thermal energy from the heat generating components 114 and exhausts the heat to the atmosphere through the heat exchanger 126. The cooling fluid may be selected based on specific properties such as, for example, specific heat capacity, thermal conductivity, latent heat of vaporization, or other thermo-physical properties.

In some embodiments the cooling fluid is in direct contact with one or more heat generating components 114. For example, the cooling fluid may pass directly over and/or around the heat generating components 114, which may be mounted on top of or embedded within the substrate 130. In such embodiments, the cooling fluid may be a dielectric cooling fluid to avoid electrically shorting the heat generating components 114. In other embodiments in which the cooling fluid is not in direct contact with conductive and/or semi-conductive components, electrically conductive cooling fluid may be utilized. In some embodiments, the cooling fluid may be purified water, or a mixture of purified water and glycol, such as, for example, an equal-part mixture of water and glycol. In some embodiments, the cooling fluid may be a hydrofluorocarbon. For example, in some embodiments the cooling fluid may be a hydrofluoroether ("HFE"), such as, for example, HFE 7100. In some embodiments, the cooling fluid may be pentafluoropropane (R-245fa). It should be understood that other cooling fluids may be utilized.

Figure 3:
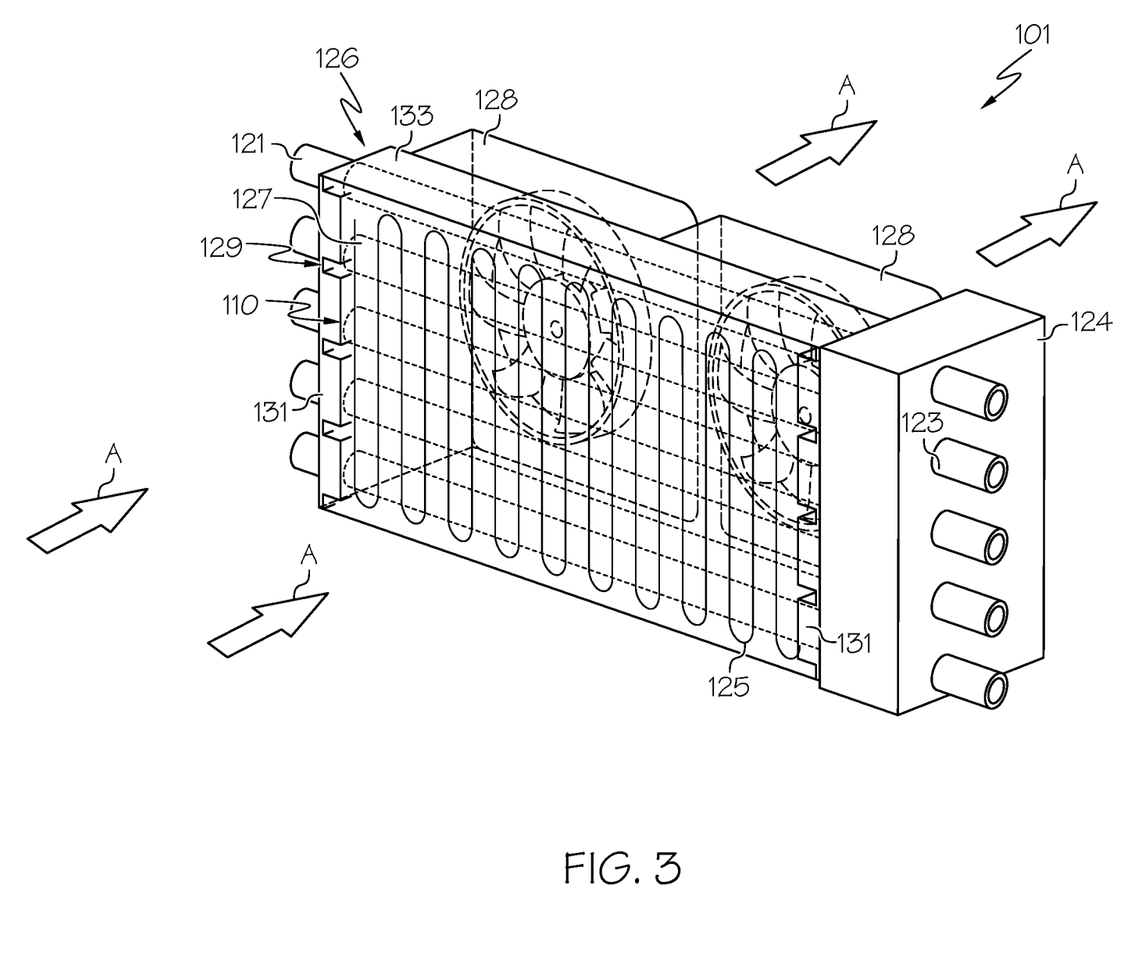
FIG. 3 schematically depicts the cooling assembly of FIG. 2 with various aspects of the cooling assembly removed for clarity, according to one or more embodiments shown and described herein.

Referring now to FIG. 3, the example cooling assembly 101 of the electronics assembly 100 of FIG. 2 is shown. The example cooling assembly includes a heat exchanger 126 comprising an inlet plenum 121, an outlet plenum 123, a series of surface area enhancement cooling coils 125, and cooling fluid lines 127 that contain cooling fluid. The cooling assembly further includes the one or more cooling fans 128, as well as cool piping legs 118 and warm piping legs 122 (not shown in FIG. 3).

The heat exchanger 126 includes structure for receiving and maintaining the circuit board assemblies 110 in the cooling assembly 101. The example heat exchanger shown in FIG. 3 includes one or more slots 129 in the heat exchanger 126 for holding the circuit board assemblies 110. For example, the slots 129 may be disposed at each edge 131 of the heat exchanger 126. The one or more slots 129 may be discontinuous along the edge 131 of the heat exchanger 126 as shown in FIG. 3. However, in other embodiments, the one or more slots 129 may continuously extend along the surface of the heat exchanger 126. The one or more slots 129 may comprise a height and a width that corresponds to the height and width of the circuit board assembly 110. As such, the circuit board assembly 110 may be held in place relative to the other components of the electronics assembly 100 by a snap fit, card-lok, or a friction fit. As a non-limiting example, latches (not shown) may be employed to lock the one or more circuit board assemblies 110 to the heat exchanger 126. In some embodiments, the circuit board assemblies 110 are held with a pin or a clip. Any mechanism for retaining the one or more circuit board assemblies 110 to the heat exchanger 126 may be employed.

In other embodiments, the one or more circuit board assemblies 110 may be permanently attached to the heat exchanger 126, such as within the one or more slots 129. For example, the one or more circuit board assemblies 110 may be soldered or adhered in place by an adhesive or secured by some other means.

Generally, with brief reference to FIG. 2, the slots 129 hold the circuit board assemblies 110 perpendicular to the heat exchanger 126 to provide maximum air flow across the heat generating components 114, and thus maximum cooling capacity of the circuit board assemblies 110, but embodiments are not so limited. For example, the circuit board assemblies 110 may be angled with respect to the heat exchanger.

As shown in FIG. 3, the one or more slots 129 that are provided in the housing 133 of the heat exchanger 126 such that the circuit board assemblies 110 are coupled directly to the heat exchanger 126. In other embodiments, the attachment structure, such as the one or more slots 129, may be provided within a housing of the one or more cooling fans 128. By directly mounting the circuit board assemblies 110 to the heat exchanger 126 or the cooling fans 128, the electronics assembly 100 can be made into a more compact form making the circuit board scale, loop cooling assembly possible. Further, less piping may be needed to fluidly couple the circuit board assemblies 110 to the heat exchanger 126 over cooling systems where the heat exchanger is located remote from the heat generating components of the circuit board assemblies.

The vertical spacing between the individual slots 129 may be based upon providing sufficient airflow past the individual circuit board assemblies such that the heat generated by the heat generating components 114 may be effectively cooled. For example, in some embodiments, the slots 129 may be equally spaced, thereby providing equal air flow and equal distance between each of the circuit board assemblies 110. In other embodiments, the slots 129 may be unequally spaced, such as, for example, to provide more air gap between circuit board assemblies 110 having higher temperature heat generating components 114 requiring more airflow. In yet other embodiments, one of the slots may be left open with no circuit board assembly 110 installed, and air flow may be directed by the housing 133 through this open position for completely unobstructed cool air flow.

The heat exchanger 126 may be any type of heat exchanger that cools a primary fluid (i.e., working fluid) by transferring heat from the primary fluid to a secondary fluid. In the particular embodiment depicted in FIG. 3, the cooling coils 125 are thermally coupled to the cooling fluid lines 127. Heat may be conducted from the cooling fluid in the cooling fluid lines 127 to the cooling coils 125 where it may be convected to a secondary fluid. The cooling coils 125 may take the shape of one or more fins. Additionally, heat may be further convected directly from the cooling fluid lines 127 to the secondary fluid. In the particular embodiment shown, the secondary fluid is air, illustrated as flowing across the cooling coils 125 by arrows A. However, like the cooling fluid, discussed above, the secondary fluid is not limited to any particular substance. While some embodiments of the electronics assembly 100 use air as the secondary fluid, aspects of the heat exchanger are contemplated that transfer thermal energy from the cooling fluid to a secondary fluid that is not air.

Several examples of the type of heat exchanger include, but are not limited to, a shell and tube heat exchanger, a plate heat exchanger, a plate and shell heat exchanger, or a plate-fin heat exchanger, and/or combinations thereof. Additionally, in some embodiments, the heat exchanger 126 may be a two-phase condenser, such as, for example, a finned condenser.

A finned condenser includes a plurality of plates that include one or more surfaces, or fins, exposed to the air or secondary cooling fluid in thermal communication with one or more finned chambers that are themselves in contact with the primary cooling fluid or cooling coils 125. As the primary cooling fluid passes over the surfaces of the one or more finned chambers, heat is transferred from the cooling fluid to the fins exposed to the air or secondary cooling fluid.

Embodiments of finned condensers may take many forms, such as, without limitation, a plain fin condenser, a herringbone fin condenser, a serrated fin condenser, or a perforated fin condenser. A plain fin condenser may generally refer to a condenser that uses a simple straight-finned triangular or rectangular design. A herringbone fin condenser may generally refer to a condenser that uses fins that are placed sideways in a zigzag pattern. Serrated fin condensers and perforated fin condensers generally contain fins that are cut and perforated, respectively, to augment flow distribution and improve heat transfer.

In embodiments of the electronics assembly 100 in which the heat exchanger 126 is a two-phase condensation, the cooling fluid has a vaporization point and a condensation point such that, at the normal operating pressure within the electronics assembly 100 (determined by system pressure control), the cooling fluid vaporizes as it passes over the surfaces of the one or more heat generating components 114, absorbing the latent heat of vaporization from the heat generating components 114, then cools and condenses in the heat exchanger 126, exhausting the absorbed heat to the atmosphere or other medium through the cooling coils 125 and/or fins.

As shown in FIG. 3, in some embodiments, the heat exchanger 126 may be assisted in the heat-removal process by the one or more cooling fans 128 coupled to the heat exchanger 126. The one or more cooling fans 128 may operate to circulate air over the cooling coils 125 of the heat exchanger 126 in a direction indicated by arrows A, thereby cooling the cooling fluid. In embodiments in which the heat exchanger 126 is a condenser, this may cause the cooling fluid to recondense into liquid form.

The cooling fans 128 may comprise axial flow fans, but embodiments are not limited thereto. It is contemplated that aspects of the present disclosure may utilize any type of fan or device configured to move air across the heat generating components 114 and the heat exchanger 126 to remove heat from the heat generating components 114. The cooling fans 128 may increase the heat removal capacity of the electronics assembly 100 by forcing air across the cooling coils 125 of the heat exchanger 126, for example, thereby removing heat from the cooling fluid contained therein, and directly by forcing air across the heat generating components 114 themselves.

The speed of the cooling fans 128 may be static or adjustable based on one or more parameters of the system, such as, without limitation, based on the instantaneous or expected heat production of the one or more heat generating components 114. For example, as more electrical power is required during acceleration of the vehicle 10, the heat generated by one or more heat generating components 114 may increase, thereby requiring greater heat dissipation to avoid malfunction of the heat generating components 114 or other components. In such a system, the speed of the cooling fan 128 may be tied directly to the temperature of the heat generating components 114, such as, for example, by measuring the temperature of the heat generating components 114 using one or more thermocouples installed within the system. The temperature of the one or more heat generating components 114 may also be obtained by some other means, such as, for example, by measuring the speed of the vehicle when it is in an electric power mode and calculating an expected temperature.

The cooling fans 128 may be sized corresponding to the size of the circuit board assemblies 110 and the heat exchanger 126. For example, in embodiments in which the circuit board assemblies 110 are directly coupled to the cooling fans 128 or to the heat exchanger 126, the cooling fans 128 may be sized such that they pull air or other secondary cooling fluid across all of the heat generating components 114 evenly to dissipate heat from each of the heat generating components 114.

As illustrated in FIGS. 2 and 3, air flows across the circuit board assemblies 110, then through the cooling coils 125 of the heat exchanger 126, removing heat from the cooling fluid, then passes through the blades of the one or more cooling fans 128. However, embodiments are not limited to this arrangement, for example, it is contemplated that air may pass through the cooling fans 128 before passing through or over the one or more circuit board assemblies 110, or that the cooling fans 128 may be placed between the circuit board assemblies 110 and the cooling coils 125 of the heat exchanger 126. Alternatively one of the slots 129 may be left open with no circuit board assembly 110 installed, and air flow may be directed by a housing through this open position for completely unobstructed cool air flow.

Referring now to FIG. 4, an exploded view of an example circuit board assembly 110 is schematically illustrated. FIG. 4 shows one non-limiting example embodiment of a circuit board assembly 110 as described in U.S. Pat. No. 8,482,919, which is hereby incorporated by reference in its entirety. It should be understood that embodiments are not limited to the circuit board assembly 110 depicted in FIG. 4 and that other configurations are also possible.

In the illustrated embodiment, the circuit board assembly 110 comprises a fluid inlet manifold layer 132, a fluid outlet manifold layer 134, a power circuit layer 136, and a control circuit layer 138. The layers of the circuit board assembly 110 may be made of any type of circuit board dielectric material such as, for example, FR-4, FR-1, CEM-1, CEM-3, HTCC, LTCC, glass, or Teflon. Other known and unknown dielectric substrates may be used for the various circuit board layers. The various layers of the circuit board assembly 110 may be coupled together by lamination, such as by epoxy resin, for example. The dimensions of the various layers of the circuit board assembly 110 may depend on the particular application in which the electronics assembly 100 is implemented, such as, for example, when the circuit board substrate 130 is sized appropriately to fit within the one or more slots 129 of the heat exchanger 126.

The fluid inlet manifold layer 132 comprises one or more component recesses 142 configured to accept the one or more heat generating components 114, such as power electronics devices. The shape of the component recesses 142 should correspond to the shape of the associated heat generating components 114 such that the heat generating components 114 are securely positioned within the component recesses 142. The component recesses 142 extend to a depth within the fluid inlet manifold layer 132. In one embodiment, the depth of the component recesses 142 is such that a top surface of the heat generating components 114 is substantially flush (i.e., embedded) with a top surface of the control circuit layer 138. In alternative embodiments, the top surface of the heat generating components 114 may be positioned below or above the top surface of the control circuit layer 138.

The fluid inlet manifold layer 132 further comprises a fluid inlet channel 140 that extends from a fluid inlet 111 (FIG. 2) at a perimeter of the fluid inlet manifold layer 132 to each of the component recesses 142. The fluid inlet channel 140 fluidly couples the fluid inlet 111 to the component recesses 142 and the heat generating components 114 disposed therein. The shape of the fluid inlet channel 140 may be optimized to provide for uniform cooling fluid flow to each of the component recesses 142. In the embodiment illustrated in FIG. 4, the walls of the fluid inlet channel 140 are curved and the area of the fluid inlet channel 140 becomes smaller at component recesses 142 positioned distally from the fluid inlet 111.

The fluid inlet manifold layer 132 acts as a manifold that delivers cooling fluid to the circuit board assembly 110. As described in more detail below, the fluid inlet 111 may be fluidly coupled to a cooling fluid reservoir or the supply header 116 (FIGS. 2 and 3) that provides cooling fluid to the circuit board assembly 110. The cooling fluid may enter the fluid inlet manifold layer 132 at the fluid inlet 111 and flow into each of the heat generating components 114 maintained within the component recesses 142.

The fluid outlet manifold layer 134 is coupled to the fluid inlet manifold layer 132. A bottom surface of the fluid outlet manifold layer 134 provides a top sealing layer of the fluid inlet channel 140, thereby maintaining the cooling fluid within the fluid inlet channel 140. The fluid outlet manifold layer 134 comprises one or more first component openings 144 and a fluid outlet channel 146. The first component openings 144 may fully extend through a thickness of the fluid outlet manifold layer 134. The geometric configuration and placement of the first component openings 144 should be such that the first component openings 144 are substantially aligned with the component recesses 142 of the fluid inlet manifold layer 132. The first component openings 144, the component recesses 142, and the second and third component openings 148 and 152 (described below) define the component openings in which the heat generating components 114 are positioned.

The fluid outlet channel 146 may extend fully through the thickness of the fluid outlet manifold layer 134, and extend from the first component openings 144 to a fluid outlet 113 located at a perimeter of the fluid outlet manifold layer 134. A top surface of fluid inlet manifold layer 132 may act as a lower surface of a fluid outlet channel defined by the fluid outlet channel 146. The fluid outlet channel 146 fluidly couples the heat generating components 114 disposed within the first component openings 144 to the fluid outlet 113 (see FIG. 2). As described above with respect to the fluid inlet channel 140, the shape of the fluid outlet channel 146 may be optimized for uniform cooling fluid flow from each of the first component openings 144.

The fluid outlet manifold layer 134 acts as a manifold that removes warmed cooling fluid from the circuit board assembly 110. The fluid outlet 113 may be fluidly coupled to a cooling fluid reservoir or to the return header 120 for returning to the inlet of the heat exchanger 126.

The power circuit layer 136 may be coupled to the fluid outlet manifold layer 134 such that a bottom surface of the power circuit layer 136 provides a top surface of the fluid outlet channel 146, thereby maintaining the cooling fluid within the fluid outlet channel defined by the fluid outlet channel 146, the top surface of the fluid inlet manifold layer 132 and the bottom surface of the power circuit layer 136.

The power circuit layer 136 comprises one or more second component openings 148 that may fully extend through the thickness of the power circuit layer 136. The geometric configuration and placement of the second component openings 148 should be such that the second component openings 148 are substantially aligned with the first component openings 144 and the component recesses 142. The shape of the second component openings 148 should be such that the heat generating components 114 may be disposed therein.

The power circuit layer 136 may further comprise one or more power connection features 150 that may electrically couple the heat generating components 114 to the power connection regions 158 and/or the control circuit components 154. The power circuit layer 136 may include electrical vias (not shown) to electrically couple the power connection features 150 to the power connections and/or the control circuit components 154. The power connection features 150 may be configured as embedded conductive traces (e.g., copper traces) that provide an electrical path for electrical signals and power to and from the heat generating components 114. In another embodiment, the power connection features 150 may be configured as electrically conductive wires positioned in recesses within the power circuit layer 136. In one embodiment, the power connection regions 158 may also be configured as conductive traces. In an alternative embodiment, the power connection regions 158 may be configured as an integrated connector that may be used to connect the circuit board assembly 110 to an external circuit or electrical system.

The control circuit layer 138 may be coupled to the power circuit layer 136 and comprises without limitation one or more third component openings 152, the power connection regions 158, and the control circuit components 154. In an alternative embodiment, the control circuit layer 138 does not include the control circuit components 154, but rather includes a control circuit connector (e.g., power connection regions 158 and a connector, not shown) that electrically couples the circuit board assembly 110 to an external control circuit. The third component openings 152 may share the geometric configuration of, and be substantially aligned with, the first and second component openings 144, 148.

The heat generating components 114 may be positioned (i.e., embedded) within the power electronics openings defined by the component recesses 142, the first component openings 144, the second component openings 148, and the third component openings 152. As described, the various layers of the circuit board substrate 130 provide both fluid and electric coupling to the power electronics devices and/or heat generating components maintained therein.

Figure 5:
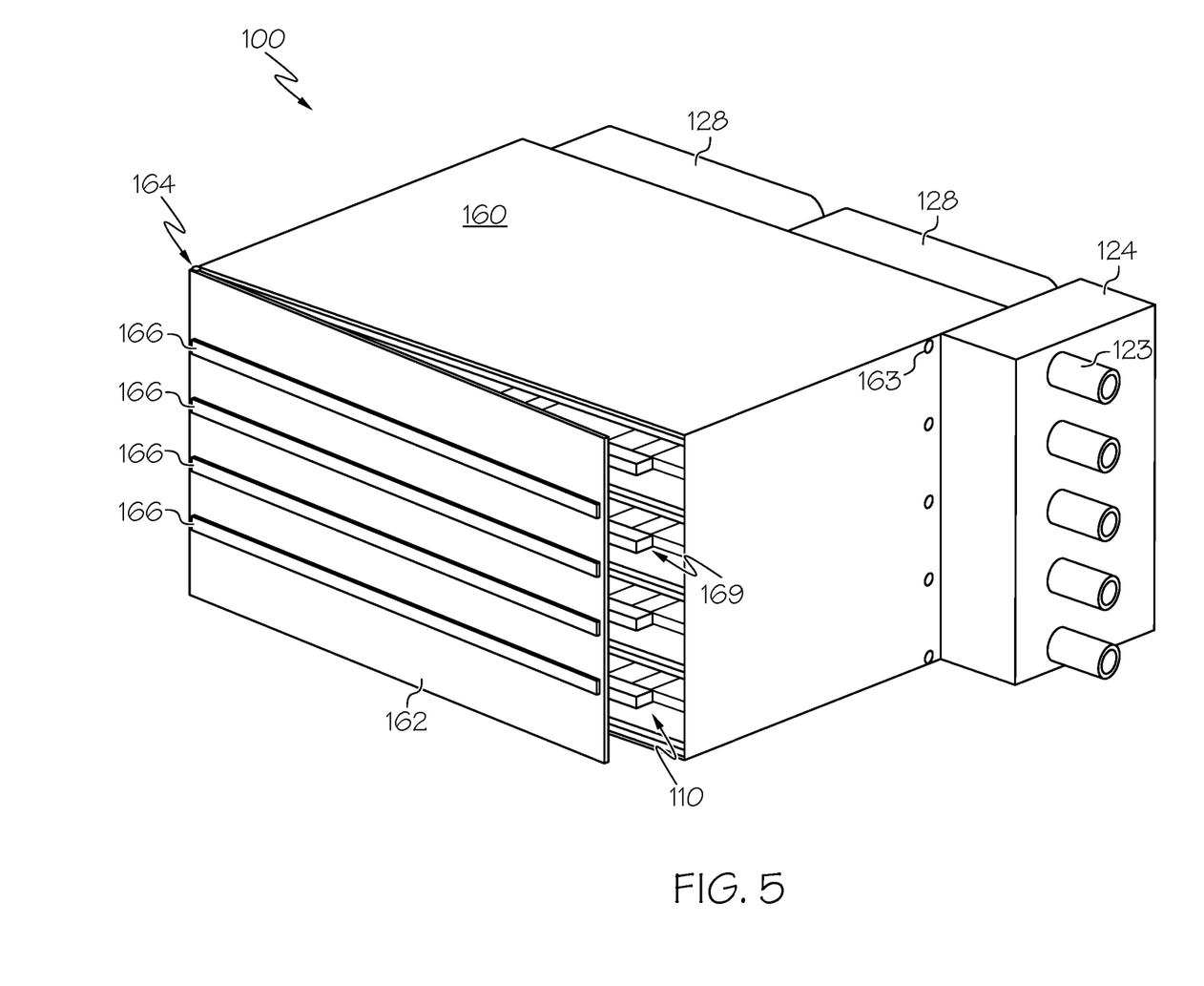
FIG. 5 schematically depicts a housing of the cooling assembly of FIG. 2, according to one or more embodiments shown and described herein.

One non-limiting example of an application of the modular electronics assembly 100 is schematically shown in FIG. 5. As illustrated, the electronics assembly 100 may be contained in a housing 160 (i.e., an outer housing). In some embodiments, the housing 160 may have a lid 162 connected to the housing 160, but embodiments are not limited thereto. As one non-limiting example, the lid 162 may be connected to the housing 160 via a hinged connection 164. The hinged connection 164 may permit access to the circuit board assemblies 110. The hinged connection 164 may provide easy access to the inner compartment 169 of the electronics assembly 100 to enable the removal or installation of additional circuit board assemblies 110. While a hinged connection 164 is illustrated, any type of connection now known or later developed may be used to connect the lid 162 to the housing 160.

The housing 160 may also include one or more louvers 166 and/or other openings that permit air to flow through the housing 160 to cool the cooling fluid and the heat generating components 114 contained therein. Some embodiments of the housing 160 may further include perforated holes 163 that provide an opening for the piping of the supply header 116 and the return header 120. The housing 160 may be constructed from metal, plastic, or any other material suitable for protecting the circuit board assemblies 110 from the environment.

As shown in FIG. 5, the pump 124 may be positioned on the outside of the housing 160, but embodiments are not so limited. It is contemplated that any of the various components of the electronics assembly 100, such as, for example, the pump 124 and the cooling fans 128 (also depicted outside the housing in FIG. 5) may be placed inside or outside of the housing 160. For example, in some embodiments, the heat exchanger 126 and the cooling fans 128 are disposed within the housing 160.

The housing 160 may prevent debris or other items from interfering with the circuit board assemblies 110 while the louvers 166 permit sufficient air flow over the circuit board assemblies 110 and the cooling coils 125. Additionally, the louvers 166 may be selectively positioned to guide air flow over specified circuit board assemblies 110 or empty slots. In this way, the heat generating components 114 of the electronics assembly 100 are protected from mechanical interference while still sufficiently cooled. The fan-facing side of the housing 160 may also include one or more louvers and/or other openings permitting and/or guiding air to flow out of the housing 160.

It should now be understood that the embodiments described herein are generally directed to electronics assemblies having a cooling assembly comprising a heat exchanger that is directly coupled to one or more circuit board substrate of one or more circuit board assemblies. By directly coupling the circuit board substrates to the heat exchanger, a more compact design is achieved, and less piping is needed to fluidly couple the one or more circuit board assemblies to the heat exchanger. In vehicular applications, cooling fluid does not need to be transported between a cooling assembly and a separately located heat exchanger, thereby minimizing the length of piping within the vehicle and providing a more compact cooling system. Moreover, as heat removal requirements increase with advances in power electronics technology, a dedicated, localized heat exchanger may help improve heat removal from the heat generating components without overwhelming the radiator of the vehicle.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An electronics assembly comprising:
   at least one circuit board substrate comprising a fluid inlet channel and a fluid outlet channel;
   at least one heat generating component coupled to the at least one circuit board substrate, wherein the at least one heat generating component is disposed between the fluid inlet channel and the fluid outlet channel;
   a heat exchanger comprising a heat exchanger housing defining at least one pair of slots, an inlet plenum fluidly coupled to the fluid outlet channel of the at least one circuit board substrate, and an outlet plenum fluidly coupled to the fluid inlet channel of the at least one circuit board substrate, wherein:
   the at least one pair of slots is disposed on a plurality of edges of the heat exchanger housing;
   the at least one circuit board substrate is mounted in the at least one pair of slots such that it is directly coupled to the heat exchanger housing; and
   the heat exchanger is a radiator;
   a pump fluidly coupled to the at least one circuit board substrate and the heat exchanger; and
   at least one cooling fan mounted to the heat exchanger opposite the at least one circuit board substrate.

2. The electronics assembly of claim 1, wherein the at least one circuit board substrate comprises two or more circuit board substrates, wherein each of the two or more circuit board substrates are mounted in at least one of the at least one pair of slots of the heat exchanger housing.

3. The electronics assembly of claim 2, wherein the two or more circuit board substrates are fluidly coupled to the heat exchanger in parallel.

4. The electronics assembly of claim 1, wherein the at least one cooling fan pulls air across the at least one circuit board substrate and through the heat exchanger to remove heat from the at least one heat generating component.

5. The electronics assembly of claim 1, wherein the at least one heat generating component comprises at least one power electronics device.

6. The electronics assembly of claim 5, wherein the at least one circuit board substrate further comprises:
   a perimeter;
   a fluid inlet manifold layer comprising the fluid inlet channel and at least one component recess, wherein the at least one heat generating component is embedded within the at least one component recess, and the fluid inlet channel extends within the circuit board substrate from the perimeter to the at least one component recess;

a fluid outlet manifold layer comprising the fluid outlet channel and at least one first component opening, wherein:
the fluid outlet manifold layer is coupled to the fluid inlet manifold layer;
the at least one heat generating component is disposed within the at least one first component opening; and
the fluid outlet channel extends within the circuit board substrate from the at least one first component opening to the perimeter of the circuit board substrate;
a power circuit layer comprising at least one second component opening, wherein the power circuit layer is coupled to the fluid outlet manifold layer, and the at least one heat generating component is disposed within the at least one second component opening; and
a control circuit layer coupled to the power circuit layer comprising at least one third component opening.

7. A vehicle comprising:
an electronics assembly comprising:
at least one circuit board substrate comprising a fluid inlet channel and a fluid outlet channel;
at least one heat generating component coupled to the at least one circuit board substrate, wherein the at least one heat generating component is disposed between the fluid inlet channel and the fluid outlet channel;
a heat exchanger comprising a heat exchanger housing defining at least one pair of slots, an inlet plenum fluidly coupled to the fluid outlet channel of the at least one circuit board substrate, and an outlet plenum fluidly coupled to the fluid inlet channel of the at least one circuit board substrate, wherein:
the at least one pair of slots is disposed on a plurality of edges of the heat exchanger housing;
the at least one circuit board substrate is mounted in the at least one pair of slots such that it is directly coupled to the heat exchanger housing; and
the heat exchanger is a radiator;
a pump fluidly coupled to the at least one circuit board substrate and the heat exchanger; and
at least one cooling fan mounted to the heat exchanger opposite the at least one circuit board substrate.

8. The vehicle of claim 7, wherein the at least one circuit board substrate comprises two or more circuit board substrates, wherein each of the two or more circuit board substrates are mounted in at least one of the at least one pair of slots of the heat exchanger housing.

9. The vehicle of claim 8, wherein the two or more circuit board substrates are fluidly coupled to the heat exchanger in parallel.

10. The vehicle of claim 7, wherein the cooling fan pulls air across the at least one circuit board substrate and through the heat exchanger to remove heat from the at least one heat generating component.

11. The vehicle of claim 7, wherein the at least one heat generating component comprises at least one power electronics device.

12. The vehicle of claim 11, wherein the circuit board substrate further comprises:

a perimeter;
a fluid inlet manifold layer comprising the fluid inlet channel and at least one component recess, wherein the at least one heat generating component is disposed within the at least one component recess, and the fluid inlet channel extends within the circuit board substrate from the perimeter to the at least one component recess;
a fluid outlet manifold layer comprising the fluid outlet channel and at least one first component opening, wherein:
the fluid outlet manifold layer is coupled to the fluid inlet manifold layer;
the at least one heat generating component is disposed within the at least one first component opening; and
the fluid outlet channel extends within the circuit board substrate from the at least one first component opening to the perimeter of the circuit board substrate;
a power circuit layer comprising at least one second component opening, wherein the power circuit layer is coupled to the fluid outlet manifold layer, and the at least one heat generating component is disposed within the at least one second component opening; and
a control circuit layer coupled to the power circuit layer comprising at least one third component opening.

13. A cooling assembly comprising:
a heat exchanger comprising a housing, an inlet plenum, an outlet plenum, and at least one cooling line fluidly coupled to the inlet plenum and the outlet plenum;
at least one cooling fan coupled to the heat exchanger;
at least one pair of slots defined by the housing of the heat exchanger configured to receive at least one circuit board substrate of at least one circuit board assembly; and
at least one heat generating component, wherein
each of the at least one pair of slots is configured to receive a circuit board substrate such that the circuit board substrate is directly mounted to the housing of the heat exchanger within the at least one pair of slots;
the at least one pair of slots is disposed on a plurality of edges of the heat exchanger housing;
the at least one heat generating component is coupled to the at least one circuit board substrate; and
the at least one cooling fan is mounted to the heat exchanger opposite the at least one circuit board substrate.

14. The cooling assembly of claim 13, wherein the at least one heat generating component comprises at least one power electronics device.

15. The cooling assembly of claim 13, further comprising at least one pump fluidly coupled to one of the inlet plenum and the outlet plenum.

16. The cooling assembly of claim 15, further comprising at least one cool piping leg fluidly coupled to the outlet plenum of the heat exchanger and at least one warm piping leg fluidly coupled to the inlet plenum of the heat exchanger.

17. The cooling assembly of claim 15, further comprising an outer housing, wherein the heat exchanger and the at least one cooling fan is disposed within the outer housing.

* * * * *